United States Patent [19]
Cassidy et al.

[11] 3,992,637
[45] Nov. 16, 1976

[54] UNCLOCKED SENSE AMPLLIFIER

[75] Inventors: Bruce M. Cassidy, Lexington, Ky.;
Raymond S. Hockedy, Underhill, Vt.

[73] Assignee: IBM Corporation, Armonk, N.Y.

[22] Filed: May 21, 1975

[21] Appl. No.: 579,354

[52] U.S. Cl. ........................ 307/235 F; 307/235 J;
307/238; 307/DIG. 3
[51] Int. Cl.² .................. H03K 5/20; G11C 11/40;
G11C 7/06
[58] Field of Search ........... 307/238, 235 F, DIG. 3,
307/235 H, 235 J, 235 K; 340/173 R;
328/146–148

[56] References Cited
UNITED STATES PATENTS

| | | | |
|---|---|---|---|
| 3,678,473 | 7/1972 | Wahlstrom | 307/238 X |
| 3,774,176 | 11/1973 | Stein et al. | 307/238 X |
| 3,838,404 | 9/1974 | Heeren | 307/DIG. 3 X |
| 3,858,060 | 12/1974 | Kenyon | 307/238 X |
| 3,882,326 | 5/1975 | Kruggel | 307/235 F |
| 3,892,984 | 7/1975 | Stein | 307/DIG. 3 X |

OTHER PUBLICATIONS

Ayling, "Differential Signal Phase Sensing and Latching Detector," IBM Tech. Dicl. Bull.; vol. 14, No. 6, p. 1674; 11/1971.

*Primary Examiner*—John S. Heyman
*Assistant Examiner*—Larry N. Anagnos
*Attorney, Agent, or Firm*—James E. Murray

[57] ABSTRACT

This specification describes a differential sense amplifier serving balanced sense lines. An imbalance in bias potential on the sense lines holds the sense amplifier in an insensitive state until just before data is to be read on the sense lines. Then a shunting device connected across the sense lines and across the inputs to the differential amplifier is activated to reduce the imbalance and thereby sensitize the differential amplifier. This shunting device is controlled by a feedback path that senses the biasing condition and shuts off the shunting device when the amplifier is in condition to perform the Read cycle.

7 Claims, 1 Drawing Figure

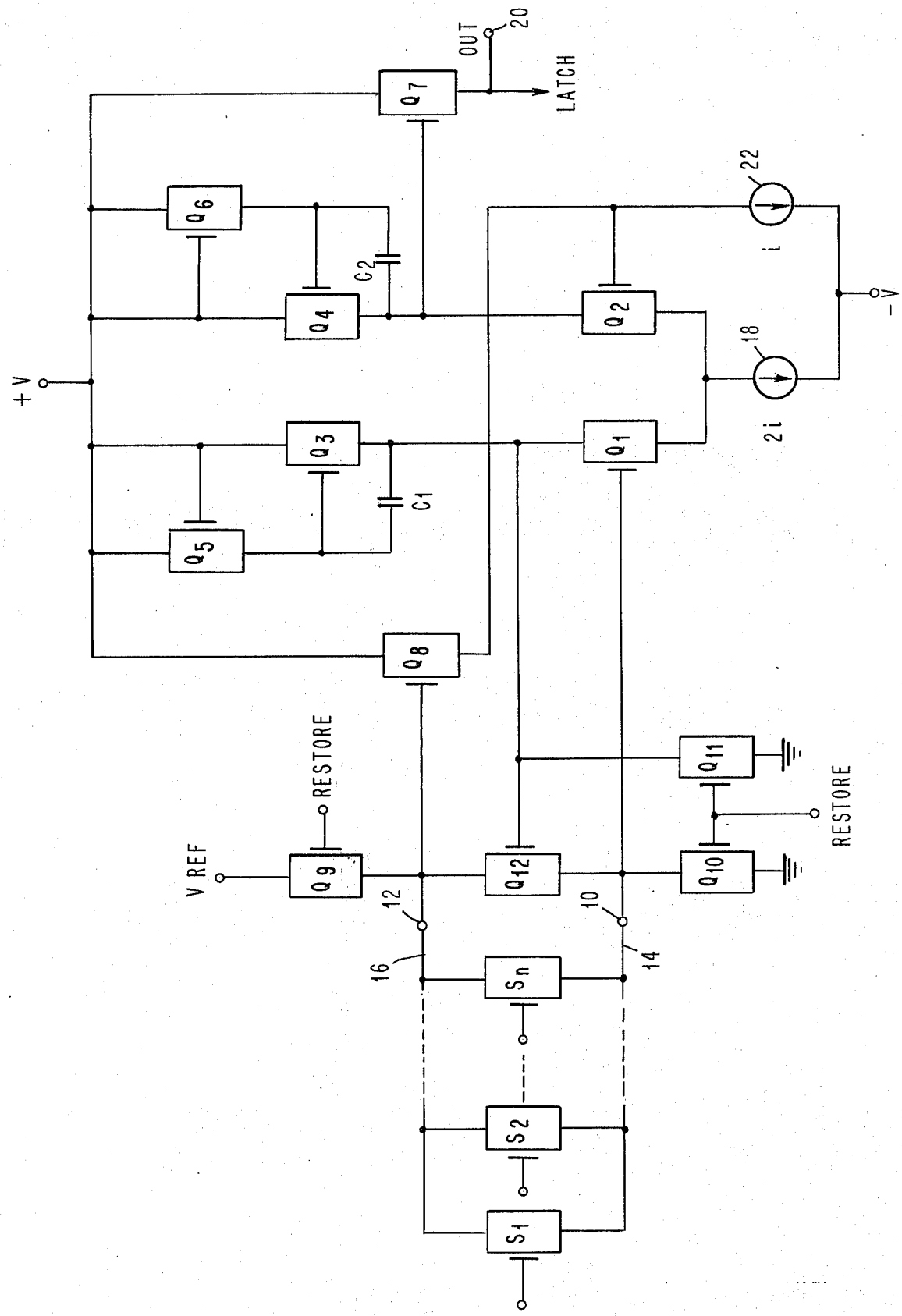

UNCLOCKED SENSE AMPLLIFIER

BACKGROUND OF THE INVENTION

The present invention relates to memory sense amplifiers and more particularly to differential sense amplifiers.

The sensitivity of differential sense amplifiers is related to the difference is the bias potential applied to the two input terminals of the sense amplifier. As the difference is made smaller the sense amplifier can sense smaller read signals on sense lines coupled to the terminals. However, the danger in making the voltage difference between the two input terminals of the sense amplifier very small is that the sense amplifier will also be sensitive to background noise on the sense lines. Techniques have been developed in which a gating device isolates a critically balanced sense amplifier from the sensing lines until the read operation is to be performed. This technique is some times referred to as strobing. While strobing does desensitize the amplifier, it requires the use of an additional clocking signal to provide the sense amplifier with the desired noise immunity.

THE INVENTION

In accordance with the present invention, a sense amplifier is provided that needs no additional timing signals to obtain noise immunity. Noise immunity is obtained by normally maintaining a potential difference between the differential sense lines that makes the sense amplifier insensitive to noise and signals on the line. Then just prior to a read operation a shunting device connected across the differential sense lines is activated into operation to bring the potentials and the differential sense amplifier very close together. A feedback circuit senses the desired potential difference and turns the shunting device off just prior to performance of the read operation or before the sensing ability of the lines is destroyed. This makes the sense amplifier very sensitive to small signals on the line without subjecting the sense amplifier to noise transients on the line.

Therefore it is an object of the present invention to provide a sense amplifier capable of sensing small differences in potential.

It is a further object of the invention to provide a sensitive sense amplifier with noise immunity.

It is still a further object of the invention to provide an unclocked differential sense amplifier with low threshold potential.

THE DRAWING

These and other objects of the invention will be apparent from the accompanying description of the sole FIGURE which is an electrical schematic of a sense amplifier incorporating the invention.

DETAILED DESCRIPTION

Referring now to the FIGURE, the input nodes 10 and 12 of the differential sense amplifier are each connected to one line 14 or 16 of a double rail output of a plurality of MNOS or MAOS storage devices $S_1$ to $S_n$ connected in parallel between the lines 14 and 16.

MNOS and MAOS devices S are variable threshold field effect transistors in which information can be stored by the setting of the threshold level of the potential that must be applied to the gate of the device before the device conducts. If the threshold is set at a high level a binary 0 is stored in the device. If the threshold is set at a low level a binary 1 is stored in the device. A small interrogation signal to the gate of a device S will indicate whether a 0 or a 1 has been stored in that device in the setting of the threshold level. If the interrogation signal does not cause the device to conduct, the device is in the high threshold state and stores a binary 0 while if the threshold device does conduct, the device S is in the low threshold state and stores a binary 1. The setting of the states of the devices S is well known and does not constitute part of the invention so will not be described herein.

The sensing devices of the differential sense amplifier are two FET devices, Q1 and Q2 with their sources both connected to a constant current source 18 and their drains connected to a source of positive potential +V through an FET device, Q3 or Q4. The gate potential of each of the devices Q3 and Q4 is regulated by another FET device, Q5 or Q6 and capacitor, C1 or C2. Conduction of device Q5 and Q6 initially sets the potential in the gates of the device, Q3 and Q4. The voltage difference between the gates and sources of devices Q3 and Q4 is then maintained through changes in potential at the sources by the bootstrapping operation of the capacitors, C1 and C2.

The drain of one of the sensing devices Q2 is connected to the gate of another FET device Q7 for providing the output of the sense amplifier. The output of device Q7 goes to a latch and to an output terminal 20. When the device Q2 is conducting the potential in the output terminal will be down and when device Q2 is non-conducting the potential on the output terminal will be up. As shall be seen hereinafter a down output at read time is an indication that a binary 0 was sensed on the sense lines 14 and 16 and an up output at read time indicates that a binary 1 was sensed on the sense lines 14 and 16.

The gates of devices Q1 and Q2 are coupled to the input terminals 10 and 12 of the sense amplifier. The gate of device Q1 is connected directly to terminal 10 while the gate of device Q2 is connected to the source of an FET device Q8 whose gate is connected to the terminal 12. The gate of device Q2 is also connected to a current source 22 so that as the voltage at terminal 12 changes it will be reflected in changes in potential at the gate of device Q2.

In accordance with the present invention, the sense amplifier operates in three different modes of operation. The first mode of operation is the standby mode. During the standby mode an up level restore pulse is applied to the gates of three FET devices Q9, Q10 and Q11 causing those devices to conduct. The first device Q9 couples one line 16 to a source of reference potential V REF. Therefore its conduction causes line 16 to charge towards the reference potential V REF. The second device is connected between ground and the sense line 14 so that its conduction causes line 14 to be discharged towards ground potential. This maintains the voltage at node 12 higher than node 10. The difference in potential biases the gate of device Q2 significantly higher than that of device Q1 so that device Q2 conducts. This biasing of the sense lines isolates the sense amplifier from fluctuations on the sense lines 14 and 16 that are not large and rapid enough to cause the potential on the gate of device Q1 to drop below the potential on the gate of device Q2 thereby biasing device Q2 off and Q7 on to cause the voltage at the output terminals to raise and give a false indication. However this same potential bias that causes the sense amplifier output to be insensitive to noise signals also interferes with the detection of read pulses during the sensing operation.

Therefore, before the amplifier is able to sense signals the voltage differential between the two terminals has to be reduced to allow sensing without inordinately long read times. This is done during the second or balancing mode of operation. In this mode of operation the restore pulse is down therefore biasing devices Q9, Q10 and Q11 off. With devices Q9 and Q10 off, lines 16 and 14 are respectively disconnected from V reference and ground potential. With device Q1 turned off the gate of device Q12 is unclamped from ground and allowed to rise with the drain potential of the off device Q1 and in doing so turn on device Q12. When device Q12 is turned on it shunts node 10 to node 12 causing node 10 to rise and node 12 to drop in potential. As node 12 drops in potential, device Q8 becomes less conductive causing the gate potential of device Q2 to drop. Therefore with node 10 rising and node 12 dropping, the potential difference across the input of the sense amplifier drops until device Q2 approaches non-conductivity and device Q1 approaches conductivity or in other words, until the threshold level of the sense amplifier or the potential difference between the gates of device Q1 and Q2 is approximately 0. At this point the voltage at the drain of device Q1 is such that Q12 turns off leaving the sense amplifier at optimum sensitivity for sensing the read voltages across lines 14 and 16. When this occurs the amplifier is in its third or read mode of operation. To read the state of any one of the devices S a small positive interrogation potential is applied to the gate of that device. If the device S is in its high threshold state, the device S will not conduct and the output terminal 20 remains down indicating a binary 0 was stored in device S. However, if device S is in the low threshold state the device S will conduct again shunting points 10 and 12 together. The drop in potential difference between 10 and 12 now continues until the potential at the gate of device Q2 drops below the potential at the gate of device Q1 until device Q2 turns off and device Q1 conducts. When device Q2 turns off device Q7 turns on causing the potential at the output terminal 20 to rise indicating a binary 1 was stored in the interrogated device S.

Obviously a number of changes can be made in the described embodiment of the invention without departing from the spirit and scope of the invention. For instance, the load devices need not be as complicated as indicated but may be simple resistive elements or single FET devices with their gates coupled to the positive potential. Furthermore, the sense amplifier can be used to sense differential signals other than the outputs MNOS or MOAS devices.

Therefore it should be obvious to those skilled in the art that many changes can be made in the above embodiment of the invention without departing from the spirit and scope of the invention.

What is claimed is:

1. A memory sense amplifier for sensing a differential signal across a double rail memory system with inherent rail capacitance;
   a differential sense amplifier means with one input coupled to one of the rails of the memory system and the other input coupled to the other rail of the double rail input system,
   shunt balance means coupled between the two rails for reducing the potential difference between the two rails while it is on, said shunt balance means having a control terminal to turn said shunt balance means on and off,
   restore means coupled to the control terminal to maintain said shunt balance means off during a first time period and to the rails for charging the inherent capacitance of one of said rails to one potential and the other rail to a second potential during that first time period to make the sense amplifier insensitive to signals smaller than the differential voltage applied to the rails during that first period and,
   feedback means coupling the control terminal to the differential sense amplifier means for sensing the differential voltage across the sense amplifier and to turn the shunt balance means on during a second time period to reduce the differential voltage applied during the first time period and to turn the shunt restore means off during a third time period when the amplifier is in balance.

2. The sense amplifier of claim 1 wherein said shunt balance means is a semi-conductor device with a control terminal which is biased to control current flow between one controlled terminal coupled to said one rail and a second controlled terminal coupled to said other rail.

3. The sense amplifier of claim 2 wherein said differential amplifier includes two semi-conductor devices each with a control terminal coupled to one of said rails, a first controlled terminal coupled to a common current source and a second controlled terminal each connected to a separate load, the second controlled terminal of one of the semi-conductor devices being coupled to the control terminal of said semi-conductor device to form said feedback means.

4. The sense amplifier of claim 3 wherein said restore means includes,
   a second semi-conductor means having a control terminal controlling the flow of current between said one potential and said one of said rails,
   a third semi-conductor means having a control terminal controlling the current flow between said second potential and said other rail, and
   means coupled to the gates of said semi-conductor device and said second and third semi-conductor devices for simultaneously biasing said semi-conductor device off and said second and third semi-conductor devices on and also for simultaneously biasing said semi-conductor device on and said second and third semi-conductor devices off.

5. The sense amplifier of claim 4 including a fourth semi-conductor device coupled between said first rail and the control terminal of the other of said two semi-conductor devices of said differential amplifier.

6. The sense amplifier of claim 5 wherein all said semi-conductor devices are field effect transistors.

7. The sense amplifier of claim 6 including variable threshold devices coupled between the rails.

* * * * *